United States Patent [19]

Fischbeck et al.

[11] Patent Number: 4,825,227

[45] Date of Patent: Apr. 25, 1989

[54] SHEAR MODE TRANSDUCER FOR INK JET SYSTEMS

[75] Inventors: Kenneth H. Fischbeck, Hanover, N.H.; Paul A. Hoisington, Norwich, Vt.

[73] Assignee: Spectra, Inc., Hanover, N.H.

[21] Appl. No.: 161,855

[22] Filed: Feb. 29, 1988

[51] Int. Cl.$^4$ ............................................. G01D 15/16
[52] U.S. Cl. ..................................... 346/1.1; 310/333; 310/359; 346/140 R
[58] Field of Search ................. 346/140, 1.1; 310/333, 310/359

[56] References Cited

U.S. PATENT DOCUMENTS

| | | | |
|---|---|---|---|
| 2,540,412 | 2/1951 | Adler | 310/359 X |
| 3,175,107 | 3/1965 | Brussaard | 310/359 |
| 4,019,073 | 4/1977 | Vishnevsky | 310/359 X |
| 4,491,761 | 1/1985 | Grudkowski | 310/359 |
| 4,584,590 | 4/1986 | Fischbeck | 346/140 |

Primary Examiner—Joseph W. Hartary
Attorney, Agent, or Firm—Brumbaugh, Graves, Donohue & Raymond

[57] ABSTRACT

In the shear mode piezoelectric transducer for an ink jet system described in the specification, a piezoelectric plate is polarized parallel to the plane of the plate and in directions extending away from the center of the pressure chamber with which the transducer is used, and electrodes mounted on opposite surfaces of the plate impose electric fields orthogonal to the direction of polarization. The resulting shear motion of the transducer decreases the volume of the pressure chamber, ejecting a drop of ink from an orifice communicating with the pressure chamber. The piezoelectric plate used in the transducer is prepared by imposing electric fields within the plate in the direction parallel to the plane of the plate between electrodes mounted on opposite sides of the plate in the central region of the pressure chamber and electrodes mounted on opposite sides of the plate in the peripheral regions of the pressure chamber.

18 Claims, 1 Drawing Sheet

SHEAR MODE TRANSDUCER FOR INK JET SYSTEMS

BACKGROUND OF THE INVENTION

This invention relates to transducers for ink jet systems and, more particularly, to a new and improved ink jet transducer arrangement.

In U.S. Pat. No. 4,584,590, a shear mode transducer for an ink jet system is described in which a piezoelectric transducer plate is polarized in the direction perpendicular to the plane of the plate and is positioned in an ink jet head so as to provide one wall of a series of adjacent pressure chambers. By applying an electric field between adjacent electrodes mounted on one surface of the transducer at locations between the center of an ink jet pressure chamber and the periphery of the pressure chamber, the transducer may be actuated in the shear mode so that the chamber wall is deflected inwardly into the chamber to apply a pressure pulse to the ink within the chamber and thereby eject a drop of ink from the ink jet orifice communicating with the pressure chamber.

This transducer arrangement is advantageous in that the piezoelectric transducer may be polarized in the same direction and uniformly over its entire area, permitting the use of convenient transducer polarization techniques. The amount of shear motion produced by a piezoelectric transducer subjected to an electric field orthogonal to the direction of polarization in this arrangement is controlled by the $d_{15}$ coefficient, which is typically about 0.5 nanometer per volt. As a result, a relatively high voltage difference must be applied to the electrodes, which are mounted at relatively small spacings on the transducer, to obtain the required transducer deflection. For example, as described in the above-mentioned U.S. Pat. No. 4,584,590, a potential of about 200 volts is applied to electrodes which are spaced by about 0.02 inch. Accordingly, extreme care must be exercised with such transducers to make certain that there are no short circuits or leakage paths between the electrodes and substantial insulation must be maintained on the conductors leading to the transducer. These precautions add to the complexity and weight of an ink jet head which is mounted for high-speed reciprocating motion on a carriage in normal ink jet operation.

SUMMARY OF THE INVENTION

Accordingly, it is an object of the present invention to provide a shear mode transducer which overcomes the abovementioned disadvantages of the prior art.

Another object of the invention is to provide a new and improved shear mode transducer which is operable at substantially lower applied potentials than prior art shear mode transducers.

A further object of the invention is to provide a new and improved method for preparing a shear mode transducer for ink jet systems.

These and other objects of the invention are attained by providing a piezoelectric transducer with a piezoelectric plate having a polarization pattern extending parallel to the plane of the plate with the direction of polarization extending from the center of the pressure chamber toward opposite walls of the pressure chamber. More particularly, a transducer having a portion providing one wall of an ink jet pressure chamber has a piezoelectric plate which is polarized oppositely in directions extending between the center of the chamber wall portion and the edges of the chamber wall portion and electrodes mounted on opposite surfaces of the plate apply an electric field generally perpendicular to the direction of polarization to cause a shear motion of the transducer and a corresponding deflection of the pressure chamber wall formed by the transducer.

With this arrangement, the shear action is along the plane of the transducer rather than through the plane, as in the arrangement described in U.S. Pat. No. 4,584,590, producing a lever advantage equal to the width of the exciting electrode divided by the thickness of the plate and permitting the required transducer displacement to be effected by a potential difference approximately one order of magnitude less than that required by the arrangement described in U.S. Pat. No. 4,584,590 for a corresponding deflection. With such reduced electrical potential requirement, the possibility of shorting and voltage leakage are substantially eliminated and there is a corresponding reduction in the necessity for protection and insulation of the transducer.

To prepare a piezoelectric transducer useful in ink jet systems in accordance with the invention, a piezoelectric plate is polarized parallel to the plane of the plate by applying electric fields in a pattern corresponding to the configuration of the pressure chamber in the ink jet head so that the fields extend parallel to the plane of the plate and are directed from a location corresponding to the center of the pressure chamber toward locations corresponding to the edges of the pressure chamber, and electrodes are mounted on opposite surfaces of the polarized plate at locations corresponding to positions between the center and the edges of the pressure chamber.

BRIEF DESCRIPTION OF THE DRAWINGS

Further objects and advantages of the invention will be apparent from a reading of the following description in conjunction with the accompanying drawings in which.

DESCRIPTION OF PREFERRED EMBODIMENTS

Figure 1:
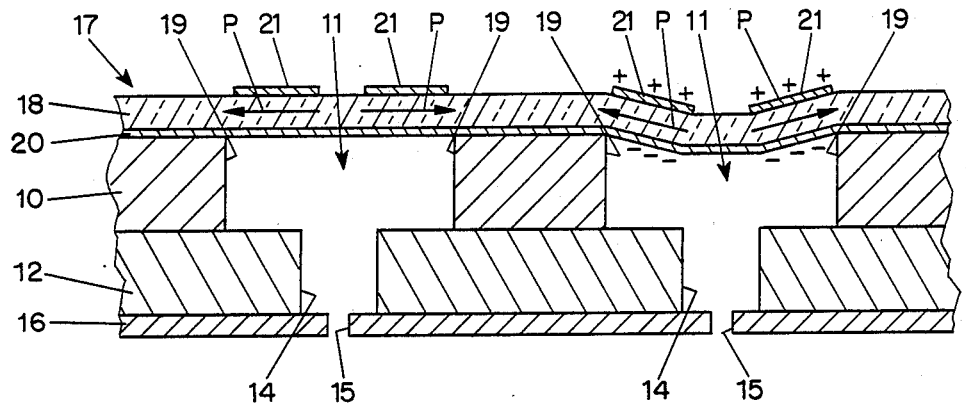
FIG. 1 is an enlarged fragmentary cross-sectional view illustrating schematically the arrangement of a typical ink jet system in accordance with the invention.
Figure 2:
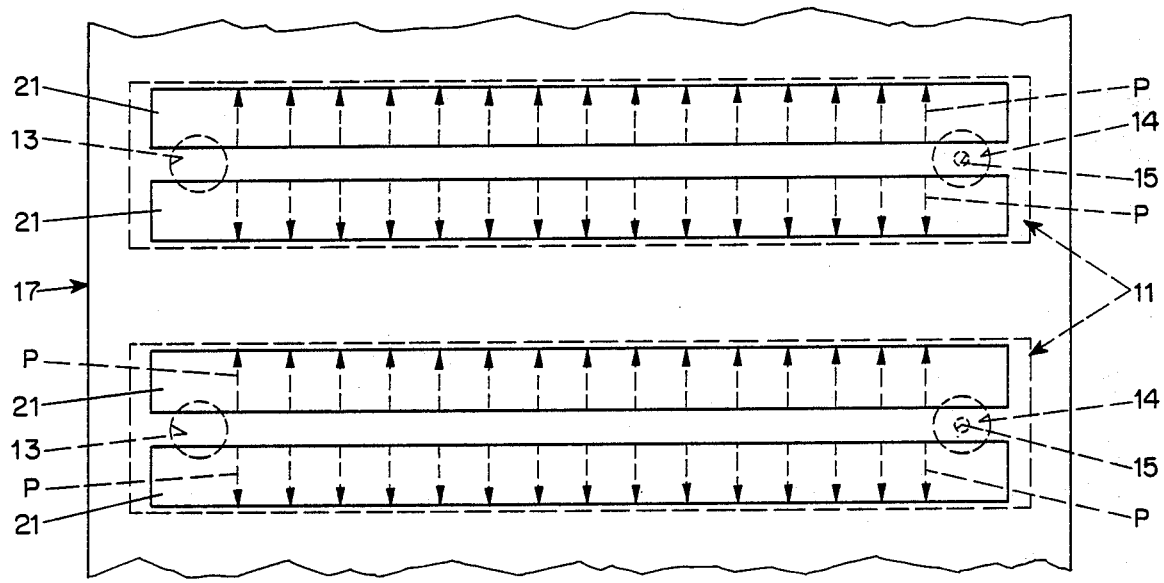
FIG. 2 is an enlarged fragmentary plan view of the system shown in FIG. 1 schematically illustrating the polarization arrangement of the piezoelectric transducer.

In the typical embodiment of the invention illustrated in the schematic views of FIGS. 1 and 2, a portion of an ink jet head includes a pressure chamber plate 10 formed in the usual manner with pressure chambers 11 to which ink is supplied during operation of the system and a stiffener plate 12 providing the lower wall for the pressure chambers as viewed in FIG. 1. As best seen in FIG. 2, the stiffener plate has apertures 13 at one end of the pressure chambers 11 to supply ink to the chambers from corresponding ink ducts (not shown) and includes similar apertures 14 at the opposite end which communicate with ink jet orifices 15 provided in an orifice plate 16. As in conventional systems, the thickness of the pressure chamber plate 10 may, for example, be about 3 mils and the pressure chambers 11 may be about 40 mils wide and 375 mils long, while the stiffener plate 12 may, for example, be about 5 to 10 mils thick with apertures 13 and 14 about 5 to 10 mils in diameter. The orifice plate 16 may, for example, be about 2 mils thick with ink jet orifices 15 about 1 mil in diameter.

In order to expel ink selectively from the pressure chambers 11 through the corresponding orifices 15 and thereby project ink drops from the ink jet head, a piezoelectric transducer member 17 is mounted adjacent to the pressure chamber plate 10 on the side opposite the stiffener plate 12 and forms the upper wall of the pressure chambers 11 as viewed in FIG. 1. The transducer member 17 includes a plate 18 of piezoelectric material and, in accordance with the invention, the piezoelectric plate 18 is polarized in the plane of the plate 18 so that the direction of polarization extends from the center of each pressure chamber toward the adjacent longest walls 19 of the pressure chamber as indicated by the arrows P in FIGS. 1 and 2.

In the illustrated example, the piezoelectric transducer member 17 includes a continuous conductive electrode 20 covering the surface of the piezoelectric plate 18 on the side toward the pressure chambers 11 and has electrode strips 21 mounted at selected positions on the side away from the pressure chambers. The electrode strips 21 have a length approximately equal to the length of the pressure chamber, and two strips are positioned opposite each pressure chamber and are located between the center and the longest walls 19 of the pressure chamber. To avoid shorting or leakage between the electrodes and adjacent conductive materials, the entire transducer member 17 may be coated with a thin layer of an insulating material (not shown).

To actuate the transducer 17 selectively so as to eject a drop of ink through an orifice 15 communicating with one of the pressure chambers 11, a voltage pulse of the appropriate polarity is applied between the corresponding electrodes 21 and the common electrode 20, producing an electric field through the adjacent portions of the transducer in a direction orthogonal to the direction of polarization. In the illustrated example, the voltage pulse on the electrodes 21 is positive. This field causes a shear motion in the affected portions of the transducer plate which deflects the center of the affected region inwardly into the pressure chamber 11 in the manner illustrated in the righthand chamber in the view shown in FIG. 1.

Because the polarization is in the plane of the piezoelectric plate, a relatively high piezoelectric coefficient, of about 0.5 to 1.0 nanometers per volt, for example, is provided and, moreover, the electric field, being applied by electrodes disposed on opposite sides of the transducer, interacts more effectively with the transducer polarization than a field applied by electrodes disposed on one surface of a transducer which is polarized perpendicularly to its length. Consequently, the transducer motion required for effective drop ejection from the orifice 15 communicating with a chamber 11 can be produced by applying a relatively low voltage, in the range of about 10 to 30 volts for example, between the selected electrodes 21 and the common electrode 20, requiring only minimal insulation on the corresponding conductors. Moreover, because the electrodes 20 and 21 are separated by the insulating piezoelectric plate 18, there is no danger of shorting o voltage leakage between them and they need only be protected by a relatively thin insulating layer against shorting or leakage to other conductive components in the system.

Figure 3:
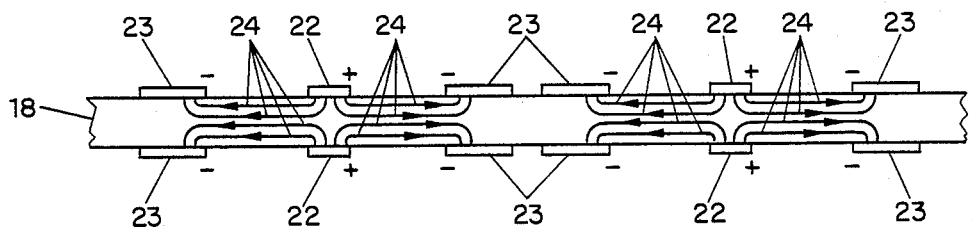
FIG. 3 is a schematic cross-sectional view illustrating a representative method for polarizing a piezoelectric plate to provide a transducer in accordance with the invention.

In order to provide a piezoelectric plate 18 having the desired polarization pattern, the sheet of piezoelectric material is disposed between polarizing electrodes providing the required polarizing fields in the manner shown in FIG. 3. To produce the polarization patterns shown in FIGS. 1 and 2, negative polarizing electrodes 23 are positioned on opposite sides of the plate 18 at locations corresponding to the centers of the pressure chambers 11 and positive polarizing electrodes 22 are positioned on opposite sides of the piezoelectric plate at locations corresponding to the portions of the pressure chamber plate 10 which provide the walls 19 of the pressure chambers. The resulting electric field applied by the electrodes produces polarization field lines 24 extending between the electrodes in the plane of the piezoelectric plate. Thereafter, the common electrode 20 is affixed to one side of the polarized plate and the strip electrodes 21 are affixed to the opposite side of the plate in the regions adjacent to the parallel field lines 24.

If desired, the common electrode 20 of FIG. 1 may consist of a plurality of strips corresponding to the electrode strips 21 and positioned across the plate 18 from those strips. In addition, the electrode strips 21, and the corresponding common electrode strips, if used, may be applied by masking techniques using a mask which is the negative of the pattern for the polarizing electrodes 22 and 23 shown in FIG. 3.

Although the invention has been described herein with reference to specific embodiments, many modifications and variations therein will readily occur to those skilled in the art. Accordingly, all such variations and modifications are included within the intended scope of the invention.

WE CLAIM:

1. A piezoelectric transducer for an ink jet system having a pressure chamber with a central region and opposite walls comprising a piezoelectric plate polarized parallel to the plane of the plate with the direction of polarization extending between a region corresponding to the central region of the pressure chamber and regions corresponding to the opposite walls of the pressure chamber.

2. A piezoelectric transducer according to claim 1 including at least two electrodes disposed on opposite surfaces of the piezoelectric plate so as to impose an electric field extending substantially orthogonally to the direction of polarization of the plate.

3. A piezoelectric transducer according to claim 1 wherein the transducer has regions corresponding to at least two ink jet system pressure chambers and including a common electrode on one surface of the piezoelectric plate extending over the region corresponding to at least two pressure chambers, and at least one electrode on the opposite surface of the piezoelectric plate in a region corresponding to each of the pressure chambers to apply an electric field extending substantially orthogonally to the direction of polarization of the plate selectively for each portion corresponding to a pressure chamber.

4. A pressure chamber arrangement for an ink jet system comprising a pressure chamber formed by a plurality of wall segments and having a central region and opposite walls, first aperture means in one of the wall segments communicating with an ink jet orifice, second aperture means in one of the wall segments communicating with an ink supply duct, and a piezoelectric transducer comprising one of the wall segments including a piezoelectric plate polarized parallel to the plane of the plate and having directions of polarization extending generally between the central region of the pressure chamber and the opposed walls of the chamber, and electrode means for imposing an electric field on portions of the piezoelectric plate forming the wall segment in a direction orthogonal to the direction of polarization of the plate to cause the transducer to move inwardly into the pressure chamber.

5. A pressure chamber arrangement according to claim 4 wherein the electrode means includes an electrode on the surface of the piezoelectric plate facing the pressure chamber and at least one other electrode on the surface of the piezoelectric plate facing away from the pressure chamber.

6. A pressure chamber arrangement according to claim 5 including at least two electrodes on the surface of the piezoelectric plate facing away from the pressure chamber in the region of the plate corresponding to the pressure chamber.

7. A method for preparing a piezoelectric transducer for use in an ink jet system having a pressure chamber comprising applying electric fields to a piezoelectric plate which extend within the plate and parallel to the plane of the plate in opposite directions with respect to the center of a region to be applied to the pressure chamber to produce a polarized piezoelectric plate.

8. A method according to claim 7 wherein the polarizing electric fields are applied by a pair of polarizing electrodes having the same polarity disposed on opposite sides of the region of the piezoelectric plate corresponding to the center of the pressure chamber and two pairs of polarizing electrodes having the opposite polarity disposed on opposite sides of the piezoelectric plate in regions corresponding to portions of the periphery of the pressure chamber.

9. A method according to claim 8 including the step of providing transducer-actuating electrodes on opposite surfaces of the polarized piezoelectric plate in regions between the portion corresponding to the center of the pressure chamber and the periphery of the pressure chamber.

10. An ink jet system pressure chamber arrangement comprising a plurality of elongated walls forming an elongated pressure chamber and piezoelectric transducer means in one wall polarized perpendicular to the direction of elongation of the pressure chamber and parallel to the surface of said one wall.

11. An ink jet system pressure chamber arrangement according to claim 10 including electrode means for imposing an electric field extending substantially orthogonally to the direction of polarization of the piezoelectric transducer means.

12. An ink jet system pressure chamber arrangement according to claim 10 wherein the piezoelectric means comprises one of the walls of each of at least two ink jet system elongated pressure chambers and including electrode means on the piezoelectric transducer means forming one of the walls of the two pressure chambers, and at least on electrode on an opposite surface of the walls formed by the piezoelectric transducer means in regions opposed to the pressure chambers to apply an electric field extending substantially orthogonally to the direction of polarization of the transducer means selectively for each portion corresponding to a pressure chamber.

13. An ink jet system pressure chamber arrangement comprising an elongated pressure chamber formed by a plurality of elongated wall segments, first aperture means in one of the wall segments communicating with an ink jet orifice, second aperture means in one of the wall segments communicating with an ink supply duct, and piezoelectric transducer means comprising one of the wall segments polarized parallel to the surface of said one wall segment and perpendicular to the length of said one wall segment, and electrode means for imposing an electric field on the piezoelectric transducer means in a direction orthogonal to the direction of polarization to cause the transducer means to move transversely to the surface of said one wall segment.

14. An ink jet system pressure chamber arrangement according to claim 13 wherein the electrode means includes an electrode on a surface of the piezoelectric transducer means facing the pressure chamber and at least one other electrode on another surface of the piezoelectric means facing away from the pressure chamber.

15. An ink jet system pressure chamber arrangement according to claim 14 including at least two electrodes on the surface of the piezoelectric transducer means facing away from the pressure chamber.

16. A method for preparing a piezoelectric transducer for use in an ink jet system having a pressure chamber comprising applying an electric field to a elongated piezoelectric member so that the field extend within the member parallel to one surface of the member in a region to be applied to the pressure chamber of an ink jet system.

17. A method according to claim 16 wherein the polarizing electric field is applied by a first pair of polarizing electrodes having the same polarity disposed on opposite sides of one portion of the piezoelectric member an a second pair of polarizing electrodes having the opposite polarity disposed on opposite sides of the piezoelectric member in a second portion spaced from the first portion.

18. A method according to claim 17 including the step of providing transducer-actuating electrodes on opposite surfaces of the polarized piezoelectric member in the region between the first and second portions of the piezoelectric member.

* * * * *

UNITED STATES PATENT AND TRADEMARK OFFICE
CERTIFICATE OF CORRECTION

PATENT NO. : 4,825,227

DATED : April 25, 1989

INVENTOR(S) : Kenneth H. Fischbeck et al.

It is certified that error appears in the above-identified patent and that said Letters Patent is hereby corrected as shown below:

First page, Abstract line 11: The word "piezeelectric" should read --piezoelectric--.

Column 3, line 67: The word "o" should read --or--.

Column 6, line 4: The words "at least on" should read --at least one--; line 39: The words "to a" should read --to an--; line 40: The word "extend" should read --extends--; line 48: The word "an" should read --and--.

Signed and Sealed this

Second Day of January, 1990

Attest:

JEFFREY M. SAMUELS

Attesting Officer   Acting Commissioner of Patents and Trademarks